US012119339B2

(12) United States Patent
Shiraki

(10) Patent No.: US 12,119,339 B2
(45) Date of Patent: Oct. 15, 2024

(54) SEMICONDUCTOR INTEGRATED CIRCUIT DEVICE

(71) Applicant: SOCIONEXT INC., Kanagawa (JP)

(72) Inventor: Yoko Shiraki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 18/423,159

(22) Filed: Jan. 25, 2024

(65) Prior Publication Data
US 2024/0162215 A1 May 16, 2024

Related U.S. Application Data

(63) Continuation of application No. 17/245,509, filed on Apr. 30, 2021, now Pat. No. 11,916,057, which is a
(Continued)

(30) Foreign Application Priority Data

Nov. 9, 2018 (JP) ................... 2018-211140

(51) Int. Cl.
H01L 27/00 (2006.01)
H01L 23/528 (2006.01)
(Continued)

(52) U.S. Cl.
CPC ...... *H01L 27/0207* (2013.01); *H01L 23/5286* (2013.01); *H01L 27/092* (2013.01); *H01L 29/0673* (2013.01); *H01L 29/775* (2013.01)

(58) Field of Classification Search
CPC ............ H01L 21/76895; H01L 21/768; H01L 21/8221; H01L 21/822; H01L 21/823807;
(Continued)

(56) References Cited

U.S. PATENT DOCUMENTS

2001/0000632 A1 5/2001 Yoshizawa
2012/0138886 A1 6/2012 Kuhn et al.
(Continued)

FOREIGN PATENT DOCUMENTS

JP H09-139429 A 5/1997
JP 2005-032839 A 2/2005
(Continued)

OTHER PUBLICATIONS

Notice of Allowance received in parent U.S. Appl. No. 17/245,509, dated Oct. 26, 2023.
(Continued)

*Primary Examiner* — Nikolay K Yushin
(74) *Attorney, Agent, or Firm* — Rimon P.C.

(57) ABSTRACT

A layout structure of a standard cell using a complementary FET (CFET) is provided. The standard cell includes a first three-dimensional transistor and a second three-dimensional transistor formed above the first transistor in the depth direction, between buried first and second power supply lines. A first contact connects a local interconnect connected to the first transistor and the first power supply line. A second contact connects a local interconnect connected to the second transistor and the second power supply line. The second contact is longer in the depth direction and greater in size in planar view than the first contact.

11 Claims, 14 Drawing Sheets

Related U.S. Application Data continuation of application No. PCT/JP2019/042396, filed on Oct. 29, 2019.

(51) Int. Cl.
*H01L 27/02* (2006.01)
*H01L 27/092* (2006.01)
*H01L 29/06* (2006.01)
*H01L 29/775* (2006.01)

(58) Field of Classification Search
CPC ............. H01L 21/8238; H01L 23/5286; H01L 23/528; H01L 23/535; H01L 23/481; H01L 27/0207; H01L 27/02; H01L 27/092; H01L 27/118; H01L 27/0688; H01L 29/0673; H01L 29/06; H01L 29/775; H01L 29/0653; H01L 29/42392; H01L 29/423; H01L 29/66439; H01L 29/66469; H01L 29/66; H01L 29/78696; H01L 29/41766; H01L 29/41733; H01L 29/41758; H01L 29/417; H01L 2027/11851; B82Y 10/00; B82Y 10/125
See application file for complete search history.

(56) References Cited

U.S. PATENT DOCUMENTS

| | | |
|---|---|---|
| 2016/0211276 A1 | 7/2016 | Liu et al. |
| 2017/0018502 A1 | 1/2017 | Ichinose |
| 2018/0197788 A1 | 7/2018 | Anderson et al. |
| 2019/0371819 A1 | 12/2019 | Iwahori |

FOREIGN PATENT DOCUMENTS

| | | |
|---|---|---|
| JP | 2014-505995 A | 3/2014 |
| JP | 2017-022302 A | 1/2017 |
| WO | 2018/150913 A1 | 8/2018 |

OTHER PUBLICATIONS

Ryckaert J. et al., "The Complementary FET (CFET) for CMOS Scaling Beyond N3," 2018 Symposium on VLSI Technology Digest of Technical Papers; pp. 141-142.
A. Mocuta et al., "Enabling CMOS Scaling Towards 3nm and Beyond," 2018 Symposium on VLSI Technology Digest of Technical Papers; pp. 147-148.
International Search Report and Written Opinion issued in International Patent Application No. PCT/JP2019/042396, dated Dec. 3, 2019; with partial English translation.

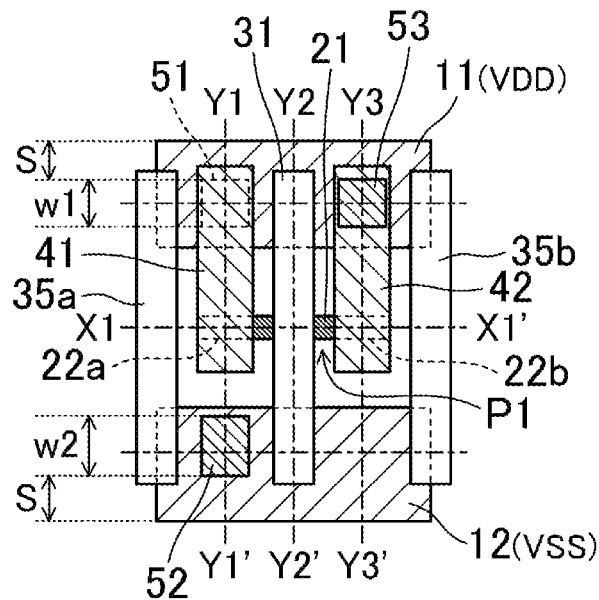
FIG.1A
LOWER PART(Pch)
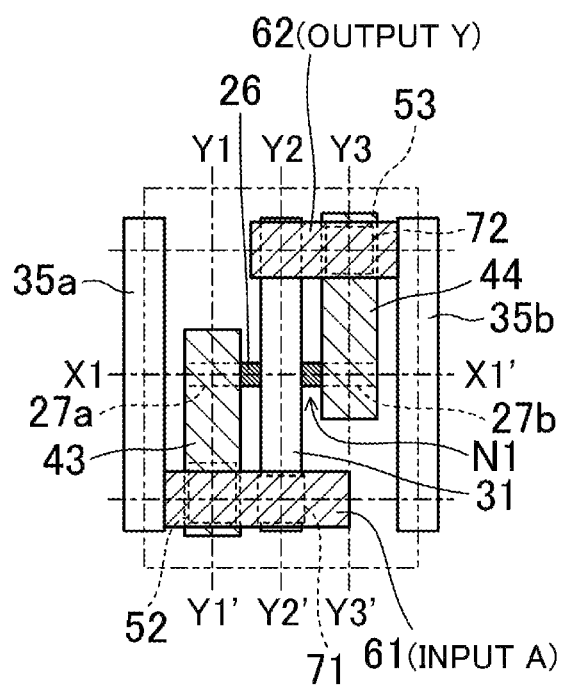
FIG.1B
UPPER PART(Nch)
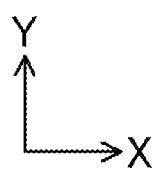
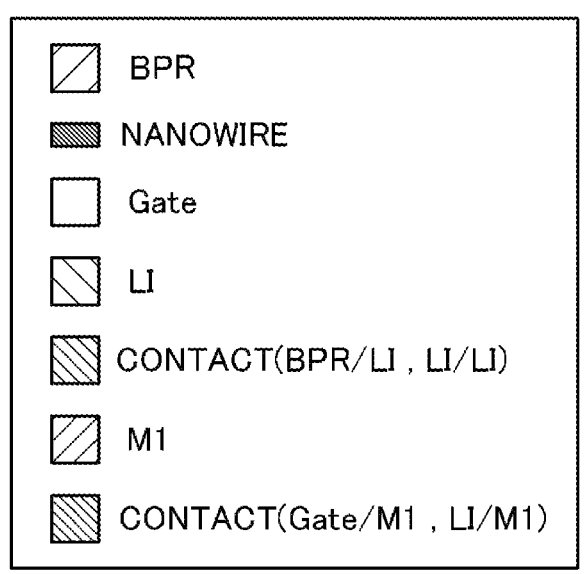

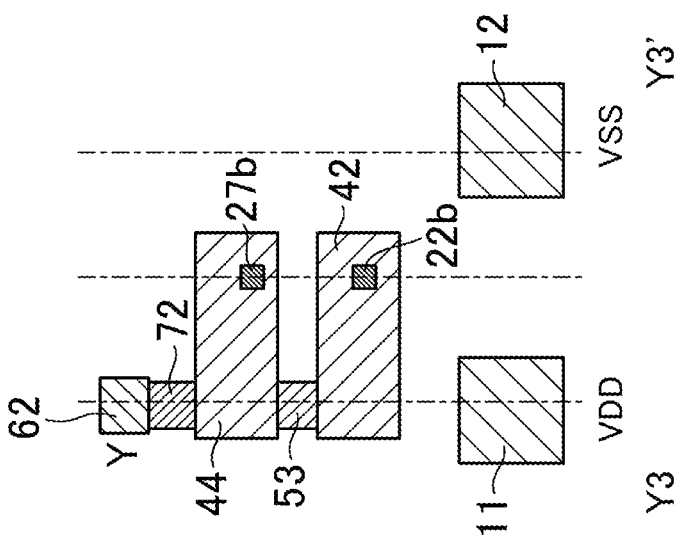
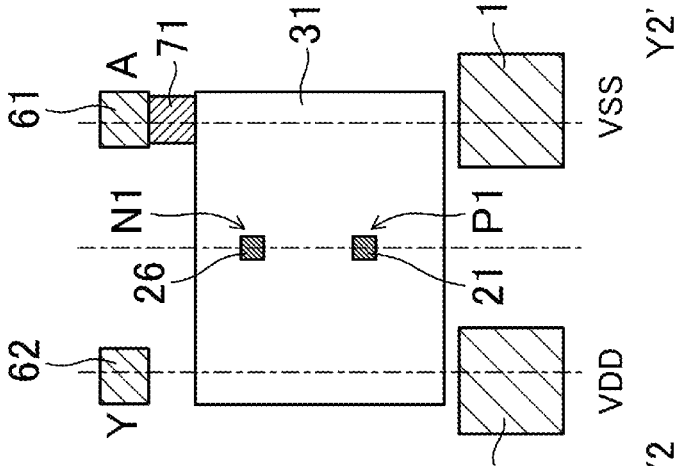
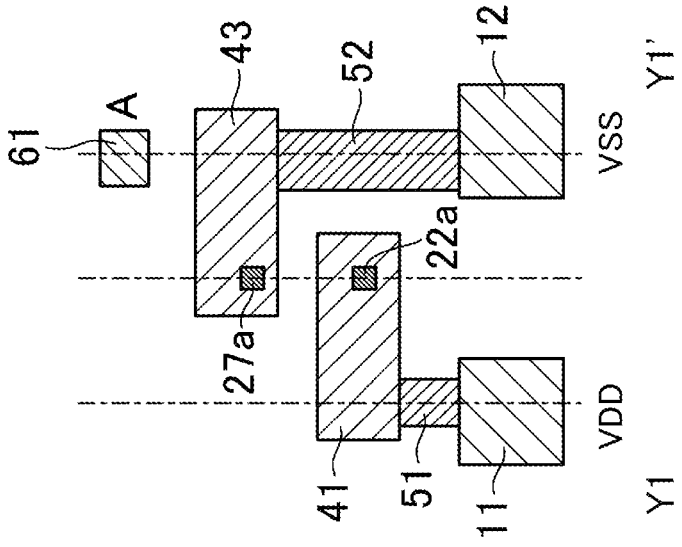

FIG.5A
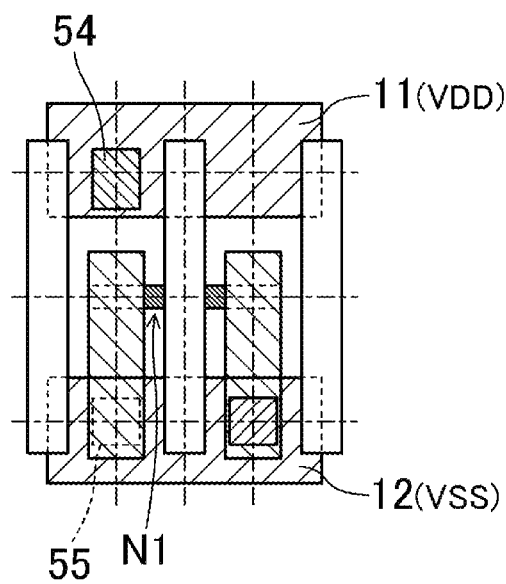
LOWER PART(Nch)
FIG.5B
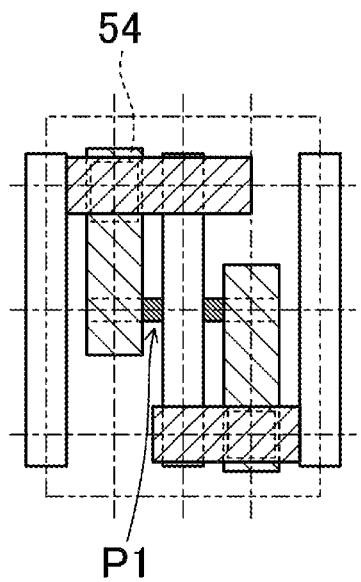
UPPER PART(Pch)
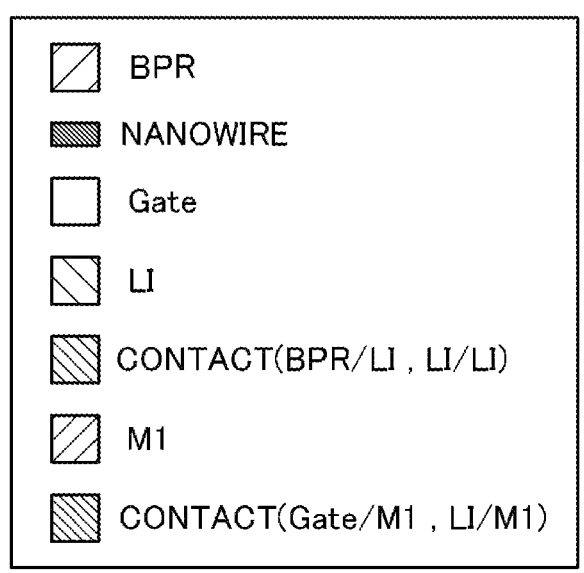

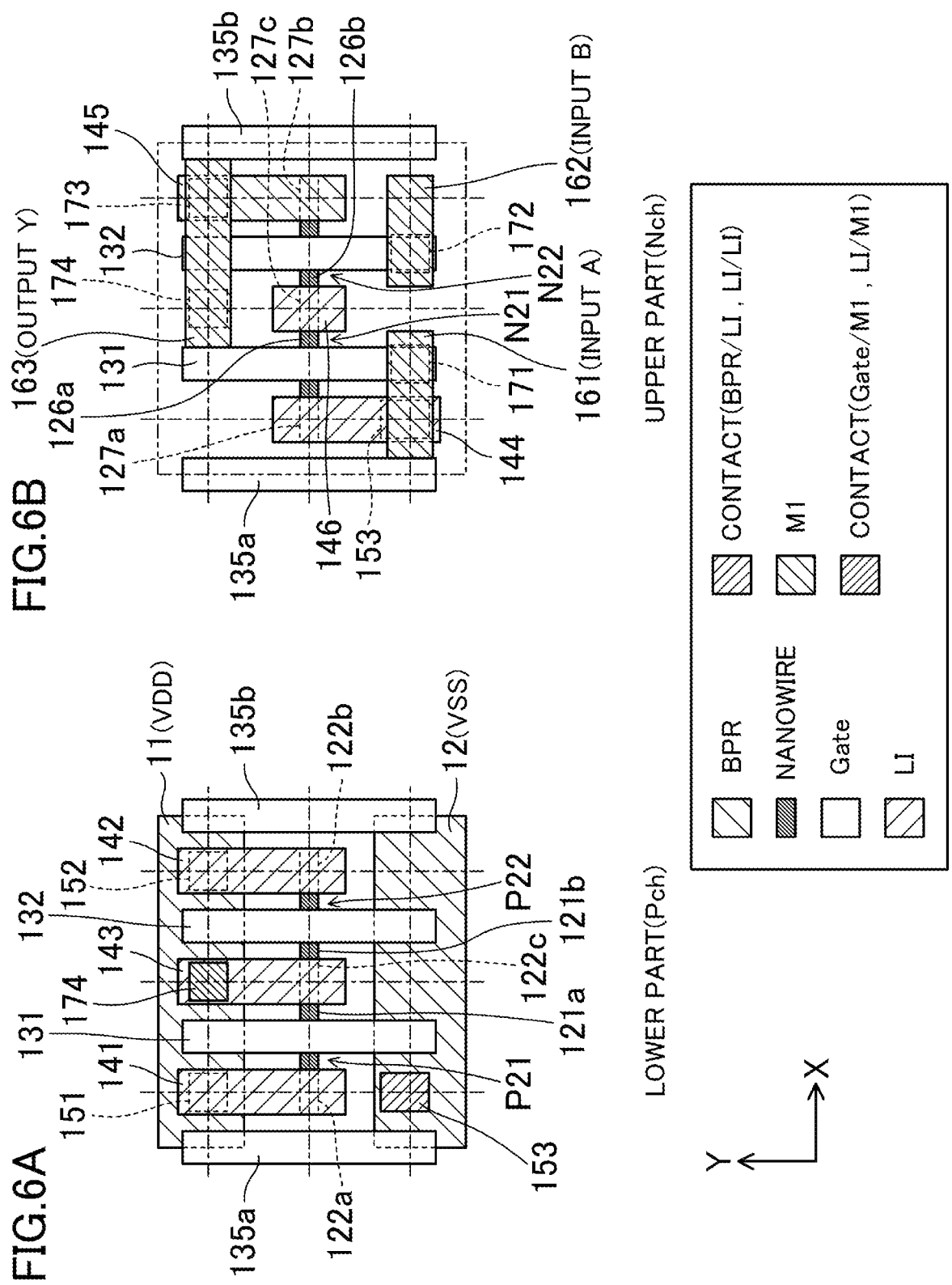

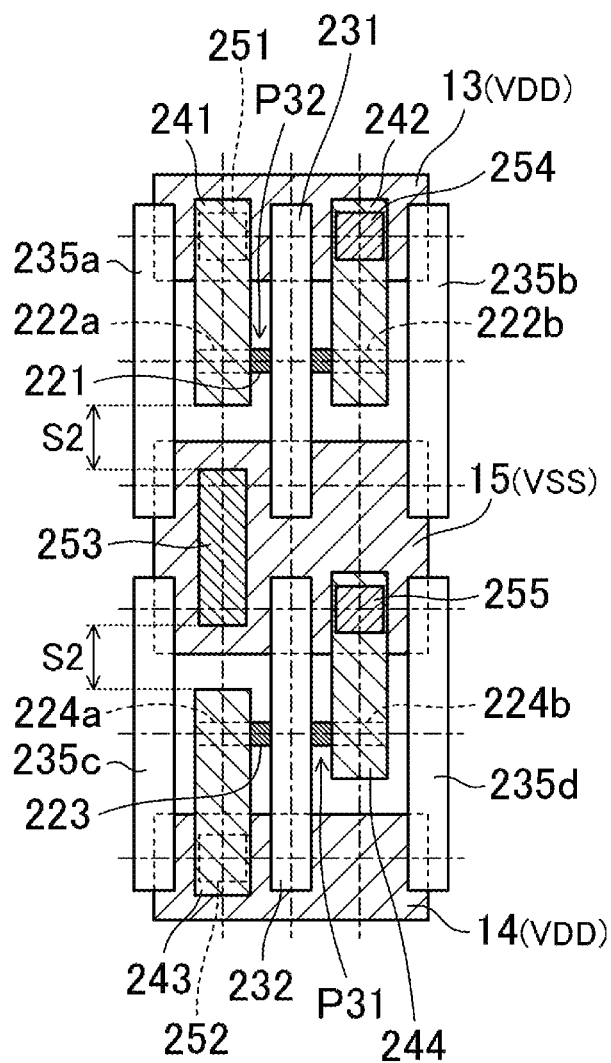
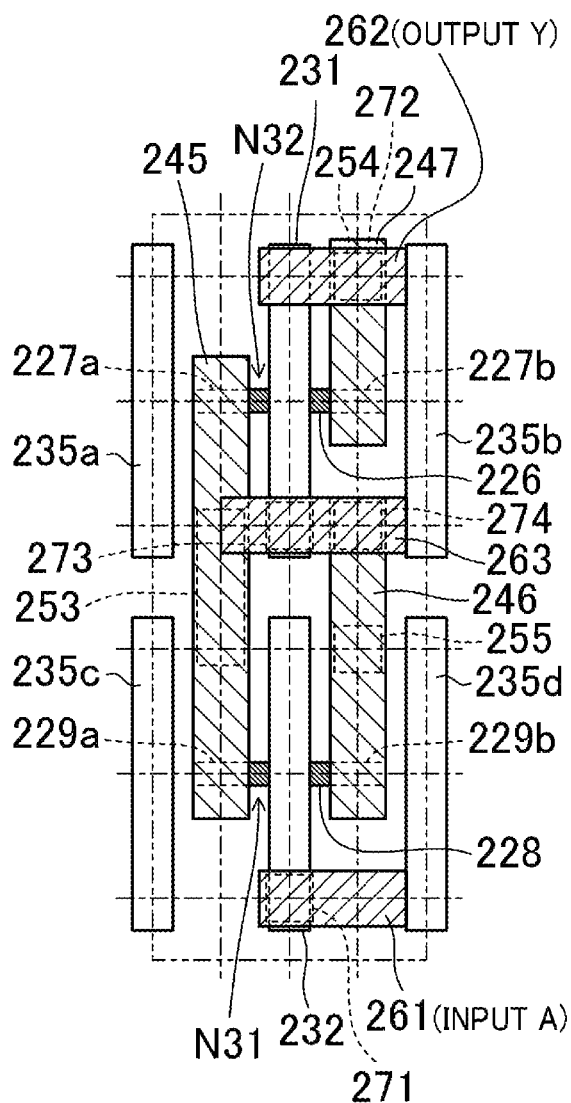
FIG.8A  LOWER PART(Pch)
FIG.8B  UPPER PART(Nch)
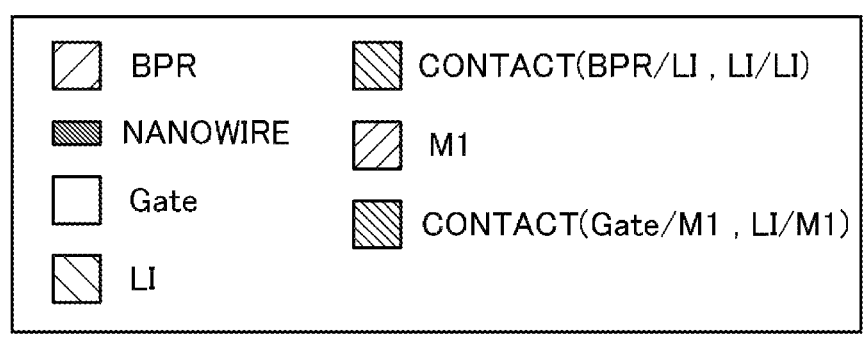

SEMICONDUCTOR INTEGRATED CIRCUIT DEVICE

CROSS-REFERENCE TO RELATED APPLICATIONS

This is a continuation of U.S. patent application Ser. No. 17/245,509, filed on Apr. 30, 2021, which in turn is a Continuation of International Application No. PCT/JP2019/042396 filed on Oct. 29, 2019, which claims priority to Japanese Patent Application No. 2018-211140 filed on Nov. 9, 2018. The entire disclosures of these applications are incorporated by reference herein.

BACKGROUND

The present disclosure relates to a semiconductor integrated circuit device provided with standard cells including three-dimensional transistors.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

In a CFET, a p-type FET and an n-type FET are stacked in the depth direction. For this reason, the distances of the p-type FET and the n-type FET from wiring layers lying above and below the FETs in the depth direction are different from each other. Therefore, in connection of the transistors to interconnects via contacts, for example, the lengths of the contacts in the depth direction are different between the p-type FET and the n-type FET, causing a possibility that the characteristics of the transistors may become unbalanced.

An objective of the present disclosure is providing a layout structure of a standard cell using a CFET in which the characteristics of transistors are kept balanced.

SUMMARY

In the first mode of the present disclosure, a semiconductor integrated circuit device including a standard cell is provided, the standard cell including: a first power supply line formed in a buried wiring layer, extending in a first direction and supplying a first power supply voltage; a second power supply line formed in the buried wiring layer, extending in the first direction and supplying a second power supply voltage different from the first power supply voltage; a first transistor that is a three-dimensional transistor of a first conductivity type lying between the first power supply line and the second power supply line as viewed in plan; a second transistor that is a three-dimensional transistor of a second conductivity type, formed above the first transistor in a depth direction, lying between the first power supply line and the second power supply line as viewed in plan; a first local interconnect formed above the buried wiring layer in the depth direction and connected to a first terminal that is to be a source or drain of the first transistor; a second local interconnect formed above the first local interconnect in the depth direction and connected to a second terminal that is to be a source or drain of the second transistor; a first contact formed at a position where the first power supply line and the first local interconnect overlap each other as viewed in plan, for connecting the first power supply line and the first local interconnect; and a second contact formed at a position where the second power supply line and the second local interconnect overlap each other as viewed in plan, for connecting the second power supply line and the second local interconnect, wherein the second contact is longer in the depth direction than the first contact and greater in size in planar view than the first contact.

According to the above mode, the standard cell includes a first transistor as a three-dimensional transistor of a first conductivity type and a second transistor as a three-dimensional transistor of a second conductivity type formed above the first transistor in the depth direction, between first and second power supply lines formed in a buried wiring layer. A first contact connects a first local interconnect connected to a terminal of the first transistor and the first power supply line. A second contact connects a second local interconnect connected to a terminal of the second transistor and the second power supply line. The second contact is longer in the depth direction than the first contact and also greater in size in planar view than the first contact. This keeps small the difference in resistance between the first and second contacts that are different in length in the depth direction, and thus reduces the difference in resistance between the power supply route to the first transistor and the power supply route to the second transistor. Therefore, the characteristics of the first and second transistors can be kept balanced.

In the second mode of the present disclosure, a semiconductor integrated circuit device including a standard cell is provided, the standard cell including: a first power supply line formed in a buried wiring layer, extending in a first direction and supplying a first power supply voltage; a second power supply line formed in the buried wiring layer, extending in the first direction and supplying a second power supply voltage different from the first power supply voltage; a first transistor that is a three-dimensional transistor of a first conductivity type lying between the first power supply line and the second power supply line as viewed in plan; a second transistor that is a three-dimensional transistor of a second conductivity type, formed above the first transistor in a depth direction, lying between the first power supply line and the second power supply line as viewed in plan; a first local interconnect formed above the buried wiring layer in the depth direction and connected to a first terminal that is to be a source or drain of the first transistor; a second local interconnect formed above the first local interconnect in the depth direction and connected to a second terminal that is to be a source or drain of the second transistor; a third local interconnect formed above the first local interconnect in the depth direction and connected to a third terminal that is to be the other of the source and drain of the second transistor; a first contact formed at a position where the first local interconnect and the third local interconnect overlap each other as viewed in plan, for connecting the first local interconnect and the third local interconnect; and a second contact formed at a position where the second power supply line and the second local interconnect overlap each other as viewed in plan, for connecting the second power supply line and the second local interconnect, wherein the second contact is greater in size in planar view than the first contact.

According to the above mode, the standard cell includes a first transistor as a three-dimensional transistor of a first conductivity type and a second transistor as a three-dimensional transistor of a second conductivity type formed above the first transistor in the depth direction, between first and second power supply lines formed in a buried wiring layer. A first contact connects a first local interconnect connected to a terminal of the first transistor and a third local interconnect connected to a terminal of the second transistor. A second contact connects a second local interconnect connected to a terminal of the second transistor and the second power supply line. The second contact is greater in size in planar view than the first contact. This keeps small the resistance of the second contact that is long in the depth direction, and thus reduces the difference in resistance between the power supply route to the first transistor and the power supply route to the second transistor. Therefore, the characteristics of the first and second transistors can be kept balanced.

In the third mode of the present disclosure, a semiconductor integrated circuit device including a standard cell is provided, the standard cell including: a first power supply line formed in a buried wiring layer, extending in a first direction and supplying a first power supply voltage; a second power supply line formed in the buried wiring layer, extending in the first direction and supplying the first power supply voltage; a third power supply line formed in the buried wiring layer, extending in the first direction between the first power supply line and the second power supply line and supplying a second power supply voltage different from the first power supply voltage; a first transistor that is a three-dimensional transistor of a first conductivity type lying between the first power supply line and the second power supply line as viewed in plan; a second transistor that is a three-dimensional transistor of a second conductivity type, formed above the first transistor in a depth direction, lying between the first power supply line and the second power supply line as viewed in plan; a first local interconnect formed above the buried wiring layer in the depth direction and connected to a first terminal that is to be a source or drain of the first transistor; a second local interconnect formed above the buried wiring layer in the depth direction and connected to a second terminal that is to be a source or drain of the second transistor; a first contact formed at a position where the first power supply line and the first local interconnect overlap each other as viewed in plan, for connecting the first power supply line and the first local interconnect; and a second contact formed at a position where the third power supply line and the second local interconnect overlap each other as viewed in plan, for connecting the third power supply line and the second local interconnect, wherein the second contact is longer in the depth direction than the first contact and greater in size in planar view than the first contact.

According to the above mode, the standard cell includes a first transistor as a three-dimensional transistor of a first conductivity type and a second transistor as a three-dimensional transistor of a second conductivity type formed above the first transistor in the depth direction, between first and second power supply lines supplying a first power supply voltage formed in a buried wiring layer. Also, a third power supply line supplying a second power supply voltage lies between the first and second power supply lines. A first contact connects a first local interconnect connected to a terminal of the first transistor and the first power supply line. A second contact connects a second local interconnect connected to a terminal of the second transistor and the third power supply line. The second contact is longer in the depth direction than the first contact and also greater in size in planar view than the first contact. This keeps small the difference in resistance between the first and second contacts that are different in length in the depth direction, and thus reduces the difference in resistance between the power supply route to the first transistor and the power supply route to the second transistor. Therefore, the characteristics of the first and second transistors can be kept balanced.

According to the present disclosure, it is possible to provide a layout structure of a standard cell using a CFET in which the characteristics of transistors are kept balanced.

BRIEF DESCRIPTION OF THE DRAWINGS

FIGS. 1A and 1B are plan views showing an example of the layout structure of a standard cell according to the first embodiment.

FIGS. 3A to 3C are cross-sectional views of the layout structure of FIGS. 1A and 1B taken in the vertical direction as viewed in plan.

FIGS. 5A and 5B are plan views showing another example of the layout structure of the standard cell according to the first embodiment.

FIGS. 6A and 6B are plan views showing an example of the layout structure of a standard cell according to the second embodiment.

FIGS. 8A and 8B are plan views showing an example of the layout structure of a standard cell according to the third embodiment.

DETAILED DESCRIPTION

Embodiments of the present disclosure will be described hereinafter with reference to the accompanying drawings. In the following embodiments, a semiconductor integrated circuit device includes a plurality of standard cells (as used herein simply called cells as appropriate), and at least some of the plurality of standard cells include a CFET, that is, a three-dimensional device in which three-dimensional p-type FET and n-type FET are stacked vertically to a substrate.

Figure 11:
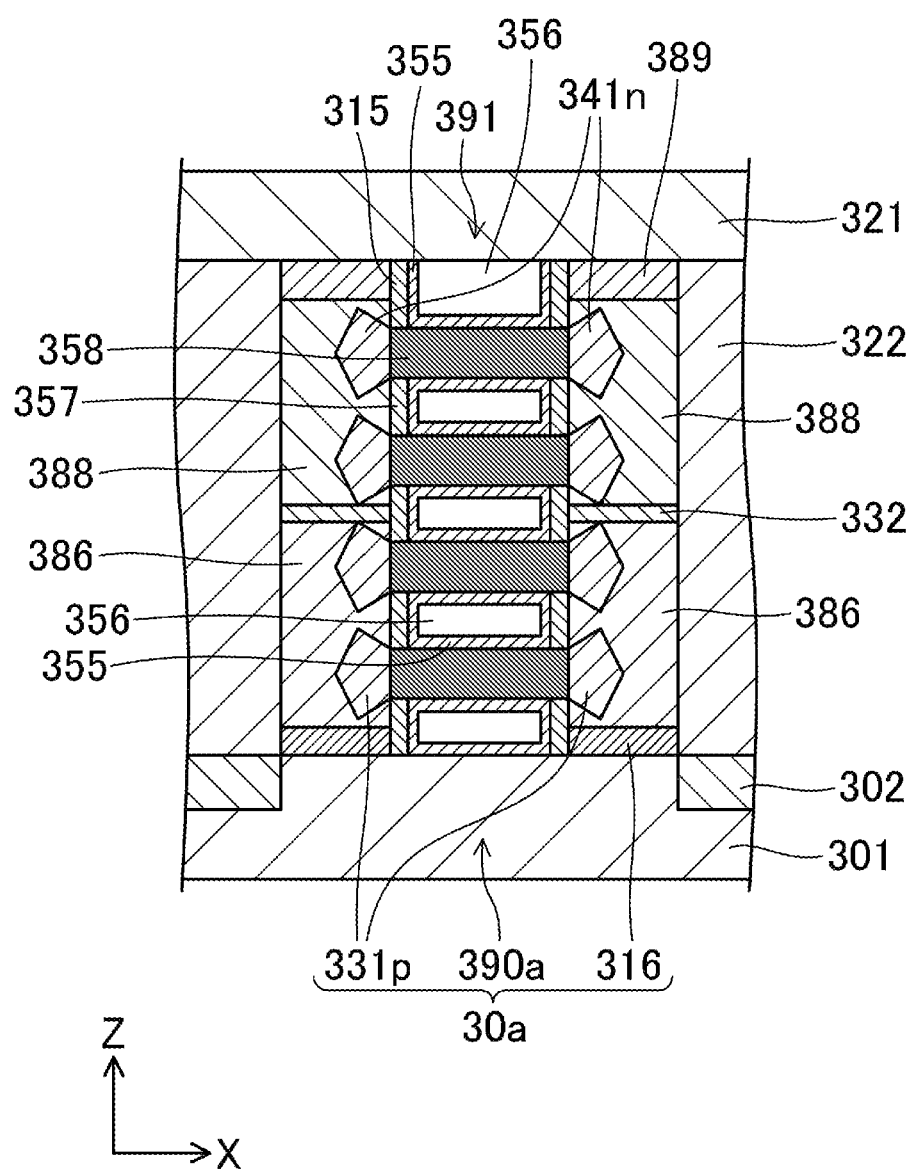
FIG. 11 is a cross-sectional view showing a structure of a semiconductor device provided with a CFET.
Figure 12:
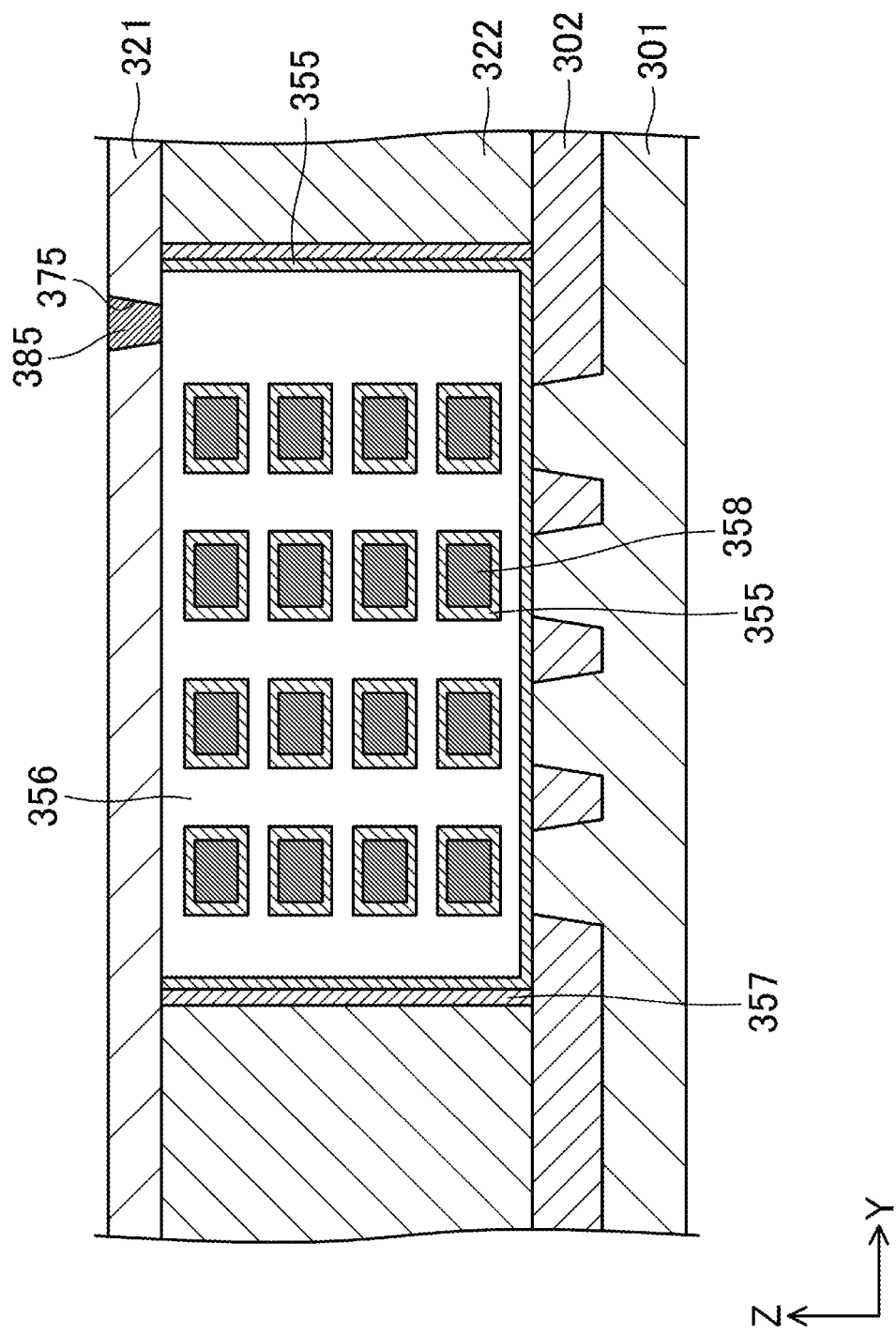
FIG. 12 is a cross-sectional view showing the structure of the semiconductor device provided with a CFET.
Figure 13:
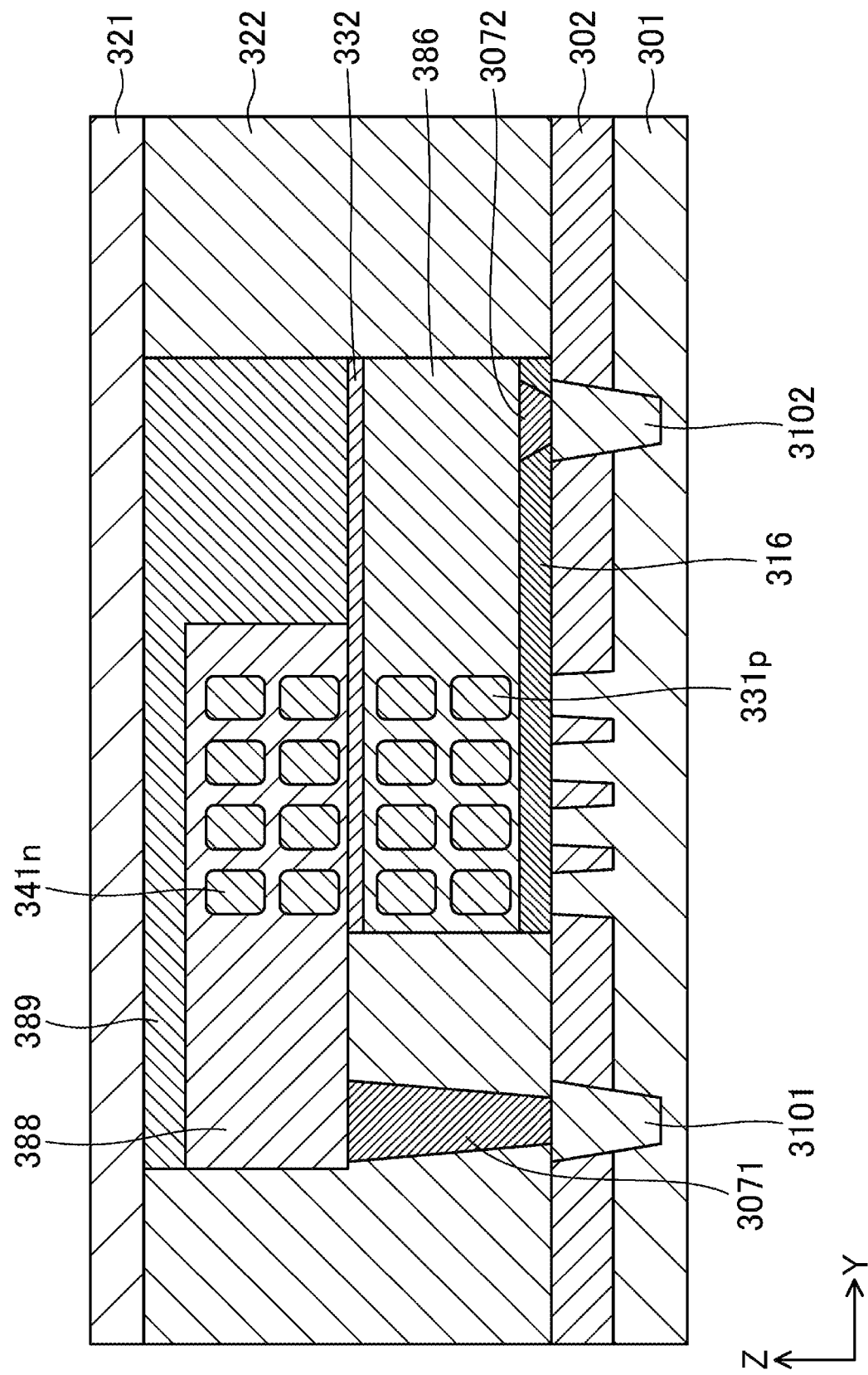
FIG. 13 is a cross-sectional view showing the structure of the semiconductor device provided with a CFET.
Figure 14:
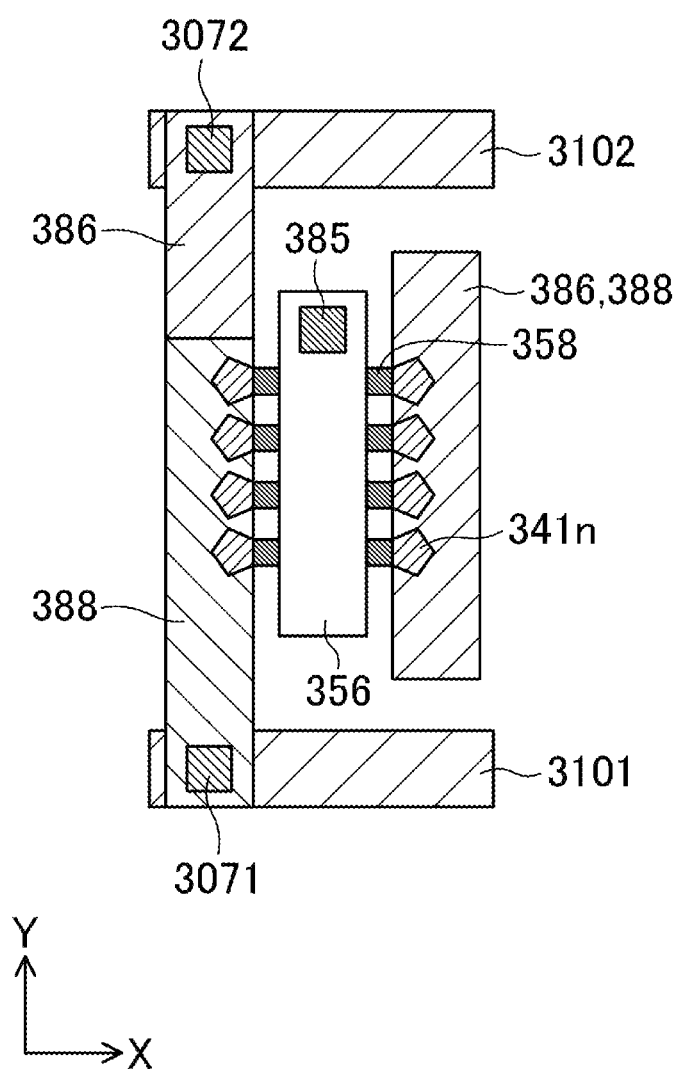
FIG. 14 is a plan view showing the structure of the semiconductor device provided with a CFET.

First, the basic structure of the CFET will be described. FIGS. 11 to 14 are views showing a structure of a semiconductor device provided with a CFET, where FIG. 11 is a cross-sectional view taken in an X direction, FIG. 12 is a cross-sectional view of a gate portion taken in a Y direction, FIG. 13 is a cross-sectional view of a source/drain portion taken in the Y direction, and FIG. 14 is a plan view. Note that the X direction refers to the direction in which nanowires extend, the Y direction refers to the direction in which a gate extends, and a Z direction refers to the direction vertical to the substrate plane. Note also that FIGS. 11 to 14 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 12, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 13, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad." In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads on both ends of the nanowires may be illustrated in simplified linear shapes in some cases. Also, as used herein, an expression indicating that sizes, etc. are identical, such as the "same size," is to be understood as including a range of manufacturing variations.

First Embodiment

Figure 2:
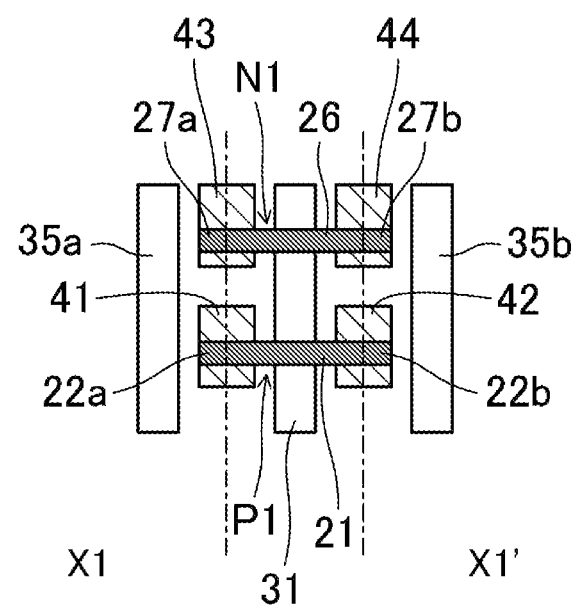
FIG. 2 is a cross-sectional view of the layout structure of FIGS. 1A and 1B taken in the horizontal direction as viewed in plan.

FIGS. 1A, 1B, 2, and 3A to 3C are views showing an example of the layout structure of a cell according to the first embodiment, where FIGS. 1A and 1B are plan views, FIG. 2 is a cross-sectional view taken in the horizontal direction as viewed in plan, and FIGS. 3A to 3C are cross-sectional views taken in the vertical direction as viewed in plan. Specifically, FIG. 1A shows a lower part, i.e., a portion including a three-dimensional transistor formed closer to a substrate (a p-type nanowire FET in the illustrated example), and FIG. 1B shows an upper part, i.e., a portion including a three-dimensional transistor formed away from the substrate (an n-type nanowire FET in the illustrated example). FIG. 2 shows a cross section taken along line X1-X1', FIG. 3A shows a cross section taken along line Y1-Y1', FIG. 3B shows a cross section taken along line Y2-Y2', and FIG. 3C shows a cross section taken along line Y3-Y3'.

Figure 4:
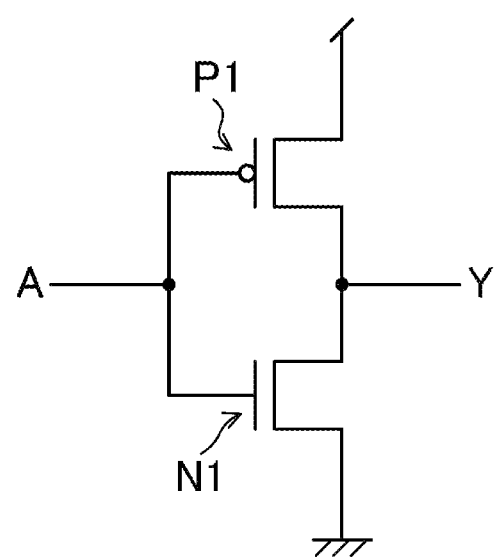
FIG. 4 is a circuit diagram of the standard cell of FIGS. 1A and 1B.

FIG. 4 is a circuit diagram of the cell shown in FIGS. 1A, 1B, 2, and 3A to 3C. As shown in FIG. 4, the cell includes a p-type transistor P1 and an n-type transistor N1, implementing an inverter circuit having an input A and an output Y.

In the following description, in the plan views such as FIGS. 1A and 1B, the horizontal direction in the figure is called the X direction (corresponding to the first direction), and the vertical direction in the figure is called the Y direction (corresponding to the second direction). The direction vertical to the substrate plane is called the Z direction (corresponding to the depth direction). Also, the dashed lines running horizontally and vertically in the plan views such as FIGS. 1A and 1B and the dashed lines running vertically in the cross-sectional views such as FIG. 2 represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

As shown in FIG. 1A, power supply lines 11 and 12 extending in the X direction are provided on both ends of the cell in the Y direction. The power supply lines 11 and 12 are both buried power rails (BPR) formed in a buried wiring layer. The power supply line 11 supplies a power supply voltage VDD and the power supply line 12 supplies a power supply voltage VSS.

Interconnects 61 and 62 extending in the X direction are formed in an M1 wiring layer: the interconnect 61 corresponds to the input A and the interconnect 62 corresponds to the output Y.

A nanowire 21 extending in the X direction is formed in the lower part of the cell, and a nanowire 26 extending in the X direction is formed in the upper part of the cell. The nanowires 21 and 26 overlap each other as viewed in plan. Pads 22a and 22b doped with a p-type semiconductor are formed at both ends of the nanowire 21, and pads 27a and 27b doped with an n-type semiconductor are formed at both ends of the nanowire 26. The nanowire 21 constitutes the channel portion of the p-type transistor P1, and each of the pads 22a and 22b constitutes a terminal that is to be the source or drain of the p-type transistor P1. The nanowire 26 constitutes the channel portion of the n-type transistor N1, and each of the pads 27a and 27b constitutes a terminal that is to be the source or drain of the n-type transistor N1. The p-type transistor P1 is formed above the buried wiring layer in the Z direction, and the n-type transistor N1 is formed above the p-type transistor P1 in the Z direction.

A gate interconnect 31 extends in the Y direction roughly in the center of the cell in the X direction and also extends in the Z direction over the lower and upper parts of the cell. The gate interconnect 31 is to be the gates of the p-type transistor P1 and the n-type transistor N1. That is, the p-type transistor P1 is constituted by the nanowire 21, the gate interconnect 31, and the pads 22a and 22b, and the n-type transistor N1 is constituted by the nanowire 26, the gate interconnect 31, and the pads 27a and 27b. Also, dummy gate interconnects 35a and 35b are formed on both ends of the cell in the X direction. Like the gate interconnect 31, the dummy gate interconnects 35a and 35b extend in the Y and Z directions.

In the lower part of the cell, local interconnects 41 and 42 are formed to extend in the Y direction. The local interconnect 41 is connected with the pad 22a, and the local interconnect 42 is connected with the pad 22b. In the upper part of the cell, local interconnects 43 and 44 are formed to extend in the Y direction. The local interconnect 43 is connected with the pad 27a, and the local interconnect 44 is connected with the pad 27b.

The local interconnect 41 extends up to a position overlapping the power supply line 11 as viewed in plan and is connected with the power supply line 11 through a contact 51. The contact 51 is formed at a position where the power supply line 11 and the local interconnect 41 overlap each other as viewed in plan. The local interconnect 43 extends up to a position overlapping the power supply line 12 as viewed in plan and is connected with the power supply line 12 through a contact 52. The contact 52 is formed at a position where the power supply line 12 and the local interconnect 43 overlap each other as viewed in plan. The local interconnects 42 and 44 are connected with each other through a contact 53. The contact 53 is formed at a position where the local interconnects 42 and 44 overlap each other as viewed in plan.

The interconnect 61 is connected with the gate interconnect 31 through a contact 71. The interconnect 62 is connected with the local interconnect 44 through a contact 72.

The n-type transistor N1 lies at a position above the p-type transistor P1, that is, a position away from the buried wiring layer. Therefore, as is found from FIG. 3A, the contact 52 connecting the power supply line 12 and the n-type transistor N1 is longer in the depth direction than the contact 51 connecting the power supply line 11 and the p-type transistor P1. For this reason, when the contacts 51 and 52 are formed to have the same size in planar view, the resistance of the contact 52 will be greater than that of the contact 51. As a result, there is a possibility that the characteristics of the transistors P1 and N1 may be unbalanced.

In this embodiment, therefore, the size of the contact 52 in planar view is made greater than that of the contact 51, to reduce the resistance of the contact 52. With this, the problem of unbalanced characteristics of the transistors P1 and N1 described above can be relieved. In the illustrated example, while the size of the contact 52 in the X direction is the same as that of the contact 51, the size thereof in the Y direction is made greater than that of the contact 51 (w2>w1). Also, in the Y direction, the distance S from the lower end of the power supply line 12 to the lower end of the contact 52 is made the same as the distance S from the upper end of the power supply line 11 to the upper end of the contact 51. The reason for this is to ensure that the contact-to-contact distance (2S) is maintained in two cells adjacent in the Y direction, as will be described later.

Also, compared to the contact 53 connecting the local interconnects 42 and 44, the contact 52 is formed longer in the depth direction than the contact 53, and is greater in size in planar view than the contact 53.

As described above, according to this embodiment, the standard cell includes the p-type transistor P1 as a nanowire FET and the n-type transistor N1 as a nanowire FET formed above the p-type transistor P1 in the depth direction, between the power supply lines 11 and 12 formed in the buried wiring layer. The contact 51 connects the local interconnect 41 connected to the pad 22a as a terminal of the p-type transistor P1 with the power supply line 11. The contact 52 connects the local interconnect 43 connected to the pad 27a as a terminal of the n-type transistor N1 with the power supply line 12. The contact 52 is longer in the Z direction than the contact 51 and greater in size in planar view than the contact 51. This keeps small the difference in resistance between the contacts 51 and 52 that are different in length in the Z direction, and thus reduces the difference in resistance between the VDD supply route to the p-type transistor P1 and the VSS supply route to the n-type transistor N1. Therefore, the characteristics of the p-type transistor P1 and the n-type transistor N1 can be kept balanced.

Other Example

FIGS. 5A and 5B are plan views showing another example of the layout structure of the cell according to this embodiment, where FIG. 5A shows a lower part and FIG. 5B shows an upper part. In the example of FIGS. 5A and 5B, the lower part includes an n-type nanowire FET (n-type transistor N1) and the upper part includes a p-type nanowire FET (p-type transistor P1). That is, the upper-lower relationship between the p-type transistor P1 and the n-type transistor N1 in the Z direction is the opposite of that in the above-described embodiment.

The layout structure of FIGS. 5A and 5B corresponds to the reversal of the layout structure of FIGS. 1A and 1B in the Y direction, and details of the configuration thereof are similar to those of the layout structure of FIGS. 1A and 1B. The size in planar view of a contact 54 connecting the power supply line 11 and the p-type transistor P1 is made greater than that of a contact 55 connecting the power supply line 12 and the n-type transistor N1, to reduce the resistance of the contact 54. In this configuration, also, similar effects to those in the above embodiment are obtained.

Second Embodiment

Figure 7:
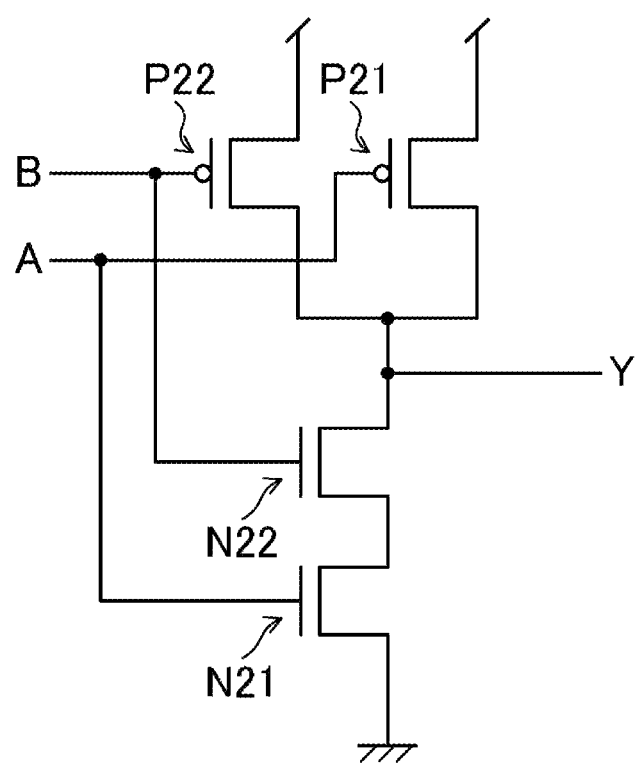
FIG. 7 is a circuit diagram of the standard cell of FIGS. 6A and 6B.

FIGS. 6A and 6B are plan views showing an example of the layout structure of a cell according to the second embodiment, where FIG. 6A shows a lower part including p-type nanowire FETs and FIG. 6B shows an upper part including n-type nanowire FETs. FIG. 7 is a circuit diagram of the cell shown in FIGS. 6A and 6B. As shown in FIG. 7, the cell includes p-type transistors P21 and P22 and n-type transistors N21 and N22, implementing a 2-input NAND circuit having inputs A and B and an output Y. Note that the cross-sectional structure of the cell will be understandable by referring to FIGS. 2 and 3A-3C shown in the first embodiment.

As shown in FIG. 6A, power supply lines 11 and 12 extending in the X direction are provided on both ends of the cell in the Y direction. The power supply lines 11 and 12 are both BPRs formed in a buried wiring layer. The power supply line 11 supplies a power supply voltage VDD and the power supply line 12 supplies a power supply voltage VSS. Interconnects 161, 162, and 163 extending in the X direction are formed in an M1 wiring layer: the interconnect 161 corresponds to the input A, the interconnect 162 corresponds to the input B, and the interconnect 163 corresponds to the output Y.

Nanowires 121a and 121b extending in the X direction are formed in the lower part of the cell, and nanowires 126a and 126b extending in the X direction are formed in the upper part of the cell. The nanowires 121a and 126a overlap each other as viewed in plan, and the nanowires 121b and 126b overlap each other as viewed in plan. A pad 122a doped with a p-type semiconductor is formed on the left of the nanowire 121a as viewed in the figure, and a pad 122b doped with a p-type semiconductor is formed on the right of the nanowire 121b as viewed in the figure. Also, a pad 122c doped with a p-type semiconductor is formed between the nanowires 121a and 121b. A pad 127a doped with an n-type semiconductor is formed on the left of the nanowire 126a as viewed in the figure, and a pad 127b doped with an n-type semiconductor is formed on the right of the nanowire 126b as viewed in the figure. Also, a pad 127c doped with an n-type semiconductor is formed between the nanowires 126a and 126b. The nanowires 121a and 121b respectively constitute the channel portions of the p-type transistors P21 and P22, the pad 122a constitutes a terminal that is to be the source or drain of the p-type transistor P21, the pad 122b constitutes a terminal that is to be the source or drain of the p-type transistor P22, and the pad 122c constitutes terminals that are to be the source or drain of the p-type transistors P21 and P22. The nanowires 126a and 126b respectively constitute the channel portions of the n-type transistors N21 and N22, the pad 127a constitutes a terminal that is to be the source or drain of the n-type transistor N21, the pad 127b constitutes a terminal that is to be the source or drain of the n-type transistor N22, and the pad 127c constitutes terminals that are to be the source or drain of the n-type transistors N21 and N22.

Gate interconnects 131 and 132 extend in the Y direction and also extend in the Z direction over the lower and upper parts of the cell. The gate interconnect 131 is to be the gates of the p-type transistor P21 and the n-type transistor N21, and the gate interconnect 132 is to be the gates of the p-type transistor P22 and the n-type transistor N22. That is, the p-type transistor P21 is constituted by the nanowire 121a, the gate interconnect 131, and the pads 122a and 122c, and the p-type transistor P22 is constituted by the nanowire 121b, the gate interconnect 132, and the pads 122b and 122c. The n-type transistor N21 is constituted by the nanowire 126a, the gate interconnect 131, and the pads 127a and 127c, and the n-type transistor N22 is constituted by the nanowire 126b, the gate interconnect 132, and the pads 127b and 127c. Also, dummy gate interconnects 135a and 135b are formed on both ends of the cell in the X direction. Like the gate interconnects 131 and 132, the dummy gate interconnects 135a and 135b extend in the Y and Z directions.

In the lower part of the cell, local interconnects 141, 142, and 143 are formed to extend in the Y direction. The local interconnect 141 is connected with the pad 122a, the local interconnect 142 is connected with the pad 122b, and the local interconnect 143 is connected with the pad 122c. In the upper part of the cell, local interconnects 144, 145, and 146 are formed to extend in the Y direction. The local interconnect 144 is connected with the pad 127a, the local interconnect 145 is connected with the pad 127b, and the local interconnect 146 is connected with the pad 127c.

The local interconnect 141 extends up to a position overlapping the power supply line 11 as viewed in plan and is connected with the power supply line 11 through a contact 151. The contact 151 is formed at a position where the power supply line 11 and the local interconnect 141 overlap each other as viewed in plan. The local interconnect 142 extends up to a position overlapping the power supply line 11 as viewed in plan and is connected with the power supply line 11 through a contact 152. The contact 152 is formed at a position where the power supply line 11 and the local interconnect 142 overlap each other as viewed in plan. The local interconnect 144 extends up to a position overlapping the power supply line 12 as viewed in plan and is connected with the power supply line 12 through a contact 153. The contact 153 is formed at a position where the power supply line 12 and the local interconnect 144 overlap each other as viewed in plan.

The interconnect 161 is connected with the gate interconnect 131 through a contact 171, and the interconnect 162 is connected with the gate interconnect 132 through a contact 172. The interconnect 163 is connected with the local interconnect 145 through a contact 173 and also connected with the local interconnect 143 through a contact 174.

The n-type transistors N21 and N22 lie at positions above the p-type transistors P21 and P22, that is, positions away from the buried wiring layer. Therefore, the contact 153 connecting the power supply line 12 and the transistor N21 is longer in the depth direction than the contacts 151 and 152 connecting the power supply line 11 and the transistors P21 and P22. For this reason, when the contacts 151, 152, and 153 are formed to have the same size in planar view, the resistance of the contact 153 will be greater than that of the contacts 151 and 152. As a result, there is a possibility that the characteristics of the transistors P21, P22, N21, and N22 may be unbalanced.

In this embodiment, therefore, the size of the contact 153 in planar view is made greater than that of the contacts 151 and 152, to reduce the resistance of the contact 153. With this, the problem of unbalanced characteristics of the transistors P21, P22, N21, and N22 described above can be relieved.

As described above, according to this embodiment, the standard cell includes the p-type transistors P21 and P22 as nanowire FETs and the n-type transistors N21 and N22 as nanowire FETs formed above the p-type transistors P21 and P22 in the depth direction, between the power supply lines 11 and 12 formed in the buried wiring layer. The contact 151 connects the local interconnect 141 connected to the pad 122a as a terminal of the p-type transistor P21 with the power supply line 11. The contact 152 connects the local interconnect 142 connected to the pad 122b as a terminal of the p-type transistor P22 with the power supply line 11. The contact 153 connects the local interconnect 144 connected to the pad 127a as a terminal of the n-type transistor N21 with the power supply line 12. The contact 153 is longer in the Z direction than the contacts 151 and 152 and greater in size in planar view than the contacts 151 and 152. This keeps small the difference in resistance between the contacts 151, 152, and 153 that are different in length in the Z direction, and thus reduces the difference in resistance between the VDD supply route to the p-type transistors P21 and P22 and the VSS supply route to the n-type transistors N21 and N22. Therefore, the characteristics of the p-type transistors P21 and P22 and the n-type transistors N21 and N22 can be kept balanced.

Third Embodiment

Figure 9:
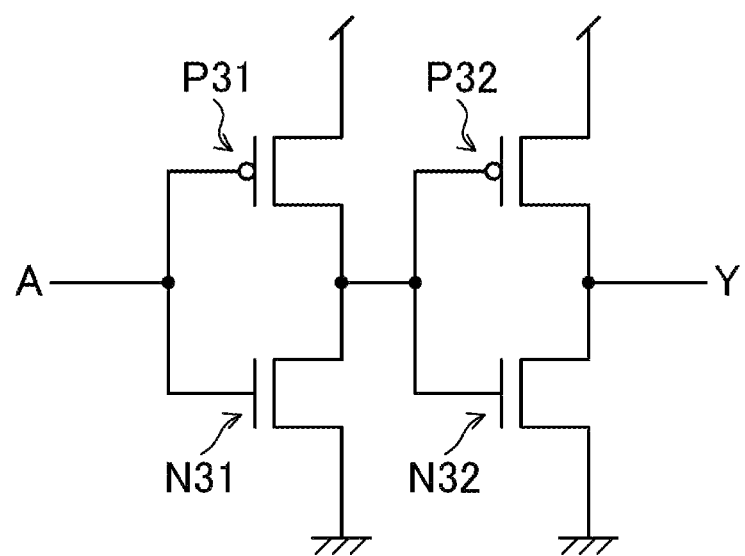
FIG. 9 is a circuit diagram of the standard cell of FIGS. 8A and 8B.

FIGS. 8A and 8B are plan views showing an example of the layout structure of a cell according to the third embodiment, where FIG. 8A shows a lower part including p-type nanowire FETs and FIG. 8B shows an upper part including n-type nanowire FETs. The cell shown in FIGS. 8A and 8B is a so-called double-height cell, having a height (size in the Y direction) double that of the cells shown in the first and second embodiments (single-height cells). FIG. 9 is a circuit diagram of the cell shown in FIGS. 8A and 8B. As shown in FIG. 9, the cell includes p-type transistors P31 and P32 and n-type transistors N31 and N32, implementing a buffer circuit having an input A and an output Y. Note that the cross-sectional structure of the cell will be understandable by referring to FIGS. 2 and 3A-3C shown in the first embodiment.

As shown in FIG. 8A, power supply lines 13 and 14 extending in the X direction are provided on both ends of the cell in the Y direction. Also, a power supply line 15 extending in the X direction is formed in the center portion of the cell in the Y direction. The width of the power supply line 15 in the Y direction is roughly double that of the power supply lines 13 and 14. The power supply lines 13, 14, and 15 are BPRs formed in a buried wiring layer. The power supply lines 13 and 14 supply a power supply voltage VDD and the power supply line 15 supplies a power supply voltage VSS.

Interconnects 261, 262, and 263 extending in the X direction are formed in an M1 wiring layer: the interconnect 261 corresponds to the input A and the interconnect 262 corresponds to the output Y.

Nanowires 221 and 223 extending in the X direction are formed in the lower part of the cell, and nanowires 226 and 228 extending in the X direction are formed in the upper part of the cell. The nanowires 221 and 226 are formed in a region between the power supply lines 13 and 15 and overlap each other as viewed in plan. The nanowires 223 and 228 are formed in a region between the power supply lines 14 and 15 and overlap each other as viewed in plan. Pads 222a and 222b doped with a p-type semiconductor are formed at both ends of the nanowire 221, and pads 224a and 224b doped with a p-type semiconductor are formed at both ends of the nanowire 223. Pads 227a and 227b doped with an n-type semiconductor are formed at both ends of the nanowire 226, and pads 229a and 229b doped with an n-type semiconductor are formed at both ends of the nanowire 228. The nanowire 221 constitutes the channel portion of the p-type transistor P32, and each of the pads 222a and 222b constitutes a terminal that is to be the source or drain of the p-type transistor P32. The nanowire 223 constitutes the channel portion of the p-type transistor P31, and each of the pads 224a and 224b constitutes a terminal that is to be the source or drain of the p-type transistor P31. The nanowire 226 constitutes the channel portion of the n-type transistor N32, and each of the pads 227a and 227b constitutes a terminal that is to be the source or drain of the p-type transistor N32. The nanowire 228 constitutes the channel portion of the N-type transistor N31, and each of the pads 229a and 229b constitutes a terminal that is to be the source or drain of the p-type transistor N31.

Gate interconnects 231 and 232 extend in the Y direction and also extend in the Z direction over the lower and upper parts of the cell. The gate interconnect 231 is formed in the region between the power supply lines 13 and 15, and the gate interconnect 232 is formed in the region between the power supply lines 14 and 15. The gate interconnect 231 is to be the gates of the p-type transistor P32 and the n-type transistor N32, and the gate interconnect 232 is to be the gates of the p-type transistor P31 and the n-type transistor N31. That is, the p-type transistor P32 is constituted by the nanowire 221, the gate interconnect 231, and the pads 222a and 222b, and the p-type transistor P31 is constituted by the nanowire 223, the gate interconnect 232, and the pads 224a and 224b. The n-type transistor N32 is constituted by the nanowire 226, the gate interconnect 231, and the pads 227a and 227b, and the n-type transistor N31 is constituted by the nanowire 228, the gate interconnect 232, and the pads 229a and 229b. Also, dummy gate interconnects 235a, 235b, 235c, and 235d are formed on both ends of the cell in the X direction. Like the gate interconnects 231 and 232, the dummy gate interconnects 235a, 235b, 235c, and 235d extend in the Y and Z directions. In the lower part of the cell, local interconnects 241, 242, 243, and 244 are formed to extend in the Y direction. The local interconnect 241 is connected with the pad 222a, the local interconnect 242 is connected with the pad 222b, the local interconnect 243 is connected with the pad 224a, and the local interconnect 244 is connected with the pad 224b. In the upper part of the cell, local interconnects 245, 246, and 247 are formed to extend in the Y direction. The local interconnect 245 is connected with the pad 227a and the pad 229a, the local interconnect 246 is connected with the pad 229b, and the local interconnect 247 is connected with the pad 227b.

The local interconnect 241 extends up to a position overlapping the power supply line 13 as viewed in plan and is connected with the power supply line 13 through a contact 251. The contact 251 is formed at a position where the power supply line 13 and the local interconnect 241 overlap each other as viewed in plan. The local interconnect 243 extends up to a position overlapping the power supply line 14 as viewed in plan and is connected with the power supply line 14 through a contact 252. The contact 252 is formed at a position where the power supply line 14 and the local interconnect 243 overlap each other as viewed in plan. The local interconnect 245 overlaps the power supply line 15 as viewed in plan and is connected with the power supply line 15 through a contact 253. The contact 253 is formed at a position where the power supply line 15 and the local interconnect 245 overlap each other as viewed in plan.

The local interconnect 242 and the local interconnect 247 are connected through a contact 254, and the local interconnect 244 and the local interconnect 246 are connected through a contact 255.

The interconnect 261 is connected with the gate interconnect 232 through a contact 271. The interconnect 262 is connected with the local interconnect 247 through a contact 272. The interconnect 263 is connected with the gate interconnect 231 through a contact 273 and also connected with the local interconnect 246 through a contact 274.

The transistors N31 and N32 lie at positions above the transistors P31 and P32, that is, positions away from the buried wiring layer. Therefore, the contact 253 connecting the power supply line 15 and the transistors N31 and N32 is longer in the depth direction than the contacts 251 and 252 connecting the power supply lines 13 and 14 with the transistors P31 and P32. For this reason, when the contacts 251, 252, and 253 are formed to have the same size in planar view, the resistance of the contact 253 will be greater than that of the contacts 251 and 252. As a result, there is a possibility that the characteristics of the transistors P31, P32, N31, and N32 may be unbalanced.

In this embodiment, therefore, the size of the contact 253 in planar view is made greater than that of the contacts 251 and 252, to reduce the resistance of the contact 253. With this, the problem of unbalanced characteristics of the transistors P31, P32, N31, and N32 described above can be relieved.

In the illustrated example, while the size of the contact 253 in the X direction is the same as that of the contacts 251 and 252, the size thereof in the Y direction is made greater than that of the contacts 251 and 252. Also, the contact 253 is formed to cross the center of the cell in the Y direction. With this, the spacing (S2) between the contact 253 and each of the local interconnects 241 and 243 opposed in the Y direction can be made sufficiently large. This improves the ease of manufacturing, reliability, and yield of the semiconductor integrated circuit device.

As described above, according to this embodiment, the standard cell includes the p-type transistors P31 and P32 as nanowire FETs and the n-type transistors N31 and N32 as nanowire FETs formed above the p-type transistors P31 and P32 in the depth direction, between the power supply lines 13 and 14 for supply of VDD formed in the buried wiring layer. Also, the power supply line 15 for supply of VSS lies between the power supply lines 13 and 14. The contact 251 connects the local interconnect 241 connected to the pad 222a as a terminal of the p-type transistor P32 with the power supply line 13. The contact 252 connects the local interconnect 243 connected to the pad 224a as a terminal of the p-type transistor P31 with the power supply line 14. The contact 253 connects the local interconnect 245 connected to the pads 227a and 229a as terminals of the n-type transistors N31 and N32 with the power supply line 15. The contact 253 is longer in the Z direction than the contacts 251 and 252 and greater in size in planar view than the contacts 251 and 252. This keeps small the difference in resistance between the contacts 251, 252, and 253 that are different in length in the Z direction, and thus reduces the difference in resistance between the VDD supply route to the p-type transistors P31 and P32 and the VSS supply route to the n-type transistors N31 and N32. Therefore, the characteristics of the p-type transistors P31 and P32 and the n-type transistors N31 and N32 can be kept balanced.

(Other Examples) The cell according to this embodiment may be configured so that the lower part includes n-type FETs (the n-type transistors N31 and N32) and the upper part includes p-type FETs (the p-type transistors P31 and P32). In this case, power supply lines for supply of VSS may be provided on both ends of the cell in the Y direction while a power supply line for supply of VDD being provided in the center portion of the cell in the Y direction, and a layout similar to that described above may be used.

Also, this embodiment can be applied to a cell having a triple height or a height greater than the triple. In this case, a contact having a large size in the Y direction, like the contact 253 described above, may be provided on a power supply line other than the power supply lines on both ends of the cell in the Y direction, whereby the difference in resistance between the VDD supply route for p-type transistors and the VSS supply route for n-type transistors can be reduced.

(Layout Example of Circuit Block)

Figure 10:
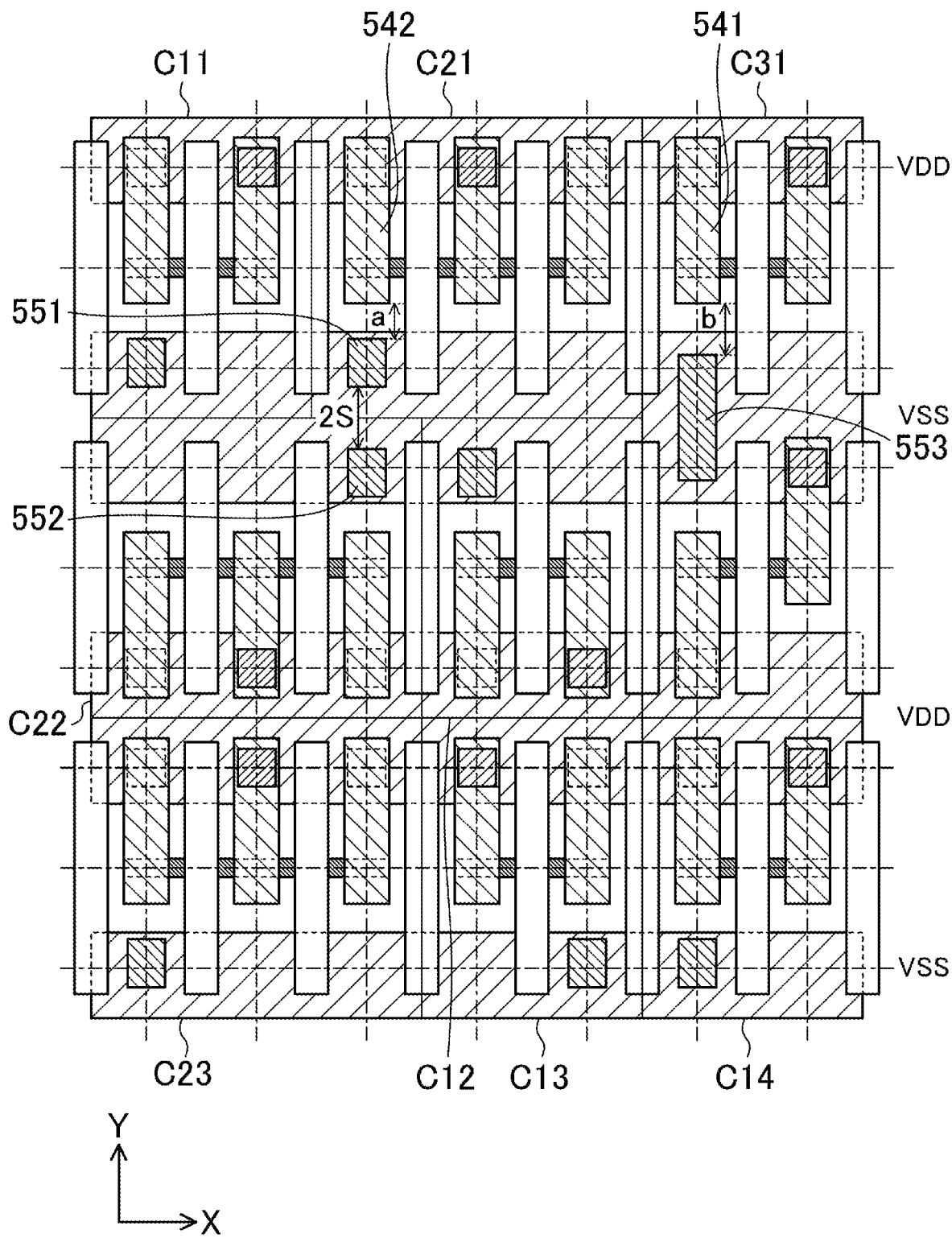
FIG. 10 shows an example of the layout of a circuit block using the standard cells described in the embodiments.

FIG. 10 shows an example of the layout of a circuit block using the cells described in the above embodiments. FIG. 10 shows the lower part of the cells. Cells C11, C12, C13, and C14 are inverter cells described in the first embodiment, cells C21, C22, and C23 are NAND cells described in the second embodiment, and a cell C31 is a buffer cell described in the third embodiment. The NAND cell C22 is inverted in the X direction and the Y direction. The inverter cell C12 is inverted in the Y direction, and the inverter cell C13 is inverted in the X direction.

In the example of FIG. 10, in the cells C21 and C22 adjacent in the Y direction, the spacing 2S is secured even in the portion where contacts 551 and 552 large in size in the Y direction are opposed. Also, in the NAND cell C21 as a single-height cell, the spacing between the contact 551 large in size in the Y direction and a local interconnect 542 opposed thereto is a. On the other hand, in the buffer cell C31 as a double-height cell, the spacing between a contact 553 large in size in the Y direction and a local interconnect 541 opposed thereto is b, which is greater than a (b>a).

In the embodiments described above, while each transistor is assumed to have one nanowire, some or all transistors may have a plurality of nanowires. In this case, the plurality of nanowires may be arranged in the Y direction as viewed in plan, or arranged in the Z direction. Alternatively, the plurality of nanowires may be arranged in both the Y direction and the Z direction. The number of nanowires included in each transistor may be different between the upper and lower parts of the cell.

Also, in the above embodiments, while the cross-sectional shape of the nanowires is roughly square, it is not limited to this. For example, the shape may be circular or rectangular.

While the above embodiments have been described taking nanowire FETs as an example of three-dimensional transistors, the transistor type is not limited to this. For example, fin transistors may be used as the transistors formed in the lower part of the cell.

According to the present disclosure, in a semiconductor integrated circuit device provided with a standard cell using a CFET, it is possible to provide a layout structure in which the characteristics of transistors are kept balanced. The present disclosure is therefore useful for improvement of the performance of a semiconductor chip, for example.

What is claimed is:

1. A semiconductor integrated circuit device including a standard cell, the standard cell comprising:
   a first line extending in a first direction in a first wiring layer;
   a second line extending in the first direction in the first wiring layer;
   a first transistor that is a three-dimensional transistor of a first conductivity type, formed above the first wiring layer in a depth direction;
   a second transistor that is a three-dimensional transistor of a second conductivity type, formed above the first transistor in the depth direction;
   a first contact connected to one of a source and a drain of the first transistor and the first line;
   a second contact connected to one of a source and a drain of the second transistor and the second line,
   wherein
   the second contact is longer in the depth direction than the first contact and greater in size in planar view than the first contact.

2. The semiconductor integrated circuit device of claim 1, wherein
   the standard cell comprises:
      a gate interconnect extending in a second direction that is a direction perpendicular to the first direction as viewed in plan and also extending in the depth direction, the gate interconnect being to be gates of the first and second transistors.

3. The semiconductor integrated circuit device of claim 1, wherein
   channel portions of the first and second transistors have an overlap as viewed in plan.

4. The semiconductor integrated circuit device of claim 1, wherein
   the standard cell comprises:
      a first local interconnect connected to the second contact, the second contact being formed at a position where the second line and the first local interconnect overlap each other as view in plan.

5. The semiconductor integrated circuit device of claim 4, wherein
   the first local interconnect extends in a second direction that is a direction perpendicular to the first direction as viewed in plan and the second contact is longer in the second direction than the first contact.

6. A semiconductor integrated circuit device including a standard cell, the standard cell comprising:
   a first line extending in a first direction in a first wiring layer;
   a first transistor that is a three-dimensional transistor of a first conductivity type, formed above the first wiring layer in a depth direction;
   a second transistor that is a three-dimensional transistor of a second conductivity type, formed above the first transistor in the depth direction;
   a first local interconnect connected to one of a source and a drain of the first transistor;
   a second local interconnect connected to one of a source and a drain of the second transistor;
   a first contact formed at a position where the first local interconnect and the second local interconnect overlap each other as viewed in plan, for connecting the first local interconnect and the second local interconnect; and
   a second contact connected to another of a source and a drain of the second transistor and the first line,
   wherein
   the second contact is greater in size in planar view than the first contact.

7. The semiconductor integrated circuit device of claim 6, wherein
   the standard cell comprises:
      a gate interconnect extending in a second direction that is a direction perpendicular to the first direction as viewed in plan and also extending in the depth direction, the gate interconnect being to be gates of the first and second transistors.

8. The semiconductor integrated circuit device of claim 6, wherein
   channel portions of the first and second transistors have an overlap as viewed in plan.

9. The semiconductor integrated circuit device of claim 6, wherein
   the first and second local interconnects extend in a second direction that is a direction perpendicular to the first direction as viewed in plan.

10. The semiconductor integrated circuit device of claim 9, wherein
    the second contact is longer in the second direction than the first contact.

11. The semiconductor integrated circuit device of claim 6, wherein
    the standard cell comprises:
       a third local interconnect connected to the second contact, the second contact being formed at a position where the first line and the third local interconnect overlap each other as view in plan.

* * * * *